(12) United States Patent
Jordan

(10) Patent No.: US 9,716,479 B2
(45) Date of Patent: Jul. 25, 2017

(54) VARIABLE GAIN AMPLIFIER

(71) Applicant: Edward Perry Jordan, Kernersville, NC (US)

(72) Inventor: Edward Perry Jordan, Kernersville, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 26 days.

(21) Appl. No.: 13/763,406

(22) Filed: Feb. 8, 2013

(65) Prior Publication Data
US 2014/0225673 A1 Aug. 14, 2014

(51) Int. Cl.
H03G 3/00 (2006.01)
H03G 3/30 (2006.01)
H03G 1/00 (2006.01)

(52) U.S. Cl.
CPC .......... H03G 3/30 (2013.01); H03G 1/0088 (2013.01)

(58) Field of Classification Search
CPC .................................................. H03G 1/0088
USPC ............................... 330/9, 282, 284, 86, 144
See application file for complete search history.

(56) References Cited

U.S. PATENT DOCUMENTS 6,545,534 B1    4/2003  Mehr
7,352,238 B2 *  4/2008  Elwan et al. .................. 330/86
8,378,731 B1 *  2/2013  Tang et al. .................... 327/306
2003/0151430 A1 *  8/2003  Hakkarainen ......... H03M 1/165
                                                    327/94
2006/0208801 A1   9/2006  Brekelmans et al.
2006/0232336 A1  10/2006  Gatti
2011/0260901 A1  10/2011  Zare-Hoseini

FOREIGN PATENT DOCUMENTS

CN    1848671    10/2006

OTHER PUBLICATIONS

OA1 issued in Chinese Patent Application Serial No. 201410045383.4 mailed Feb. 3, 2016, 7 pages.

* cited by examiner

Primary Examiner — Khiem Nguyen
(74) Attorney, Agent, or Firm — Patent Capital Group

(57) ABSTRACT

The present disclosure provides an amplifier and associated methods of operations. An exemplary amplifier an input terminal; an output terminal; a first virtual ground node; a second virtual ground node; an operational amplifier coupled with the input terminal and the output terminal; a resistive input section coupled with an input of the operational amplifier; and a resistive feedback section coupled with an output of the operational amplifier. The resistive input section includes a fixed input resistor coupled with the input terminal and the first virtual ground node, and a switchable input resistor segment coupled with the fixed input resistor in parallel. The resistive feedback section includes a fixed feedback resistor coupled with the output terminal and the first virtual ground node, and a switchable feedback resistor segment coupled with the fixed feedback resistor in parallel.

19 Claims, 2 Drawing Sheets

VARIABLE GAIN AMPLIFIER

TECHNICAL FIELD

The present disclosure relates generally to amplifiers, and more particularly, to variable gain amplifiers.

BACKGROUND

Amplifiers can increase a signal property (for example, current, voltage, power, other signal property, or a combination thereof) of an incoming signal, such as an electrical signal. One type of amplifier is a variable gain amplifier. The variable gain amplifier can include adjustable resistances in a feedback path (from an amplifier output to an amplifier input), an input path (from an input terminal to the amplifier input), or both to achieve varying gain levels. Although existing amplifiers have been generally adequate for their intended purposes, they have not been entirely satisfactory in all respects.

BRIEF DESCRIPTION OF DRAWINGS

The present disclosure is best understood from the following detailed description when read with the accompanying figures. It is emphasized that, in accordance with the standard practice in the industry, various features are not drawn to scale and are used for illustration purposes only. In fact, the dimension of the various features may be arbitrarily increased or reduced for clarity of discussion.

OVERVIEW OF EXAMPLE EMBODIMENTS

Figure 1:
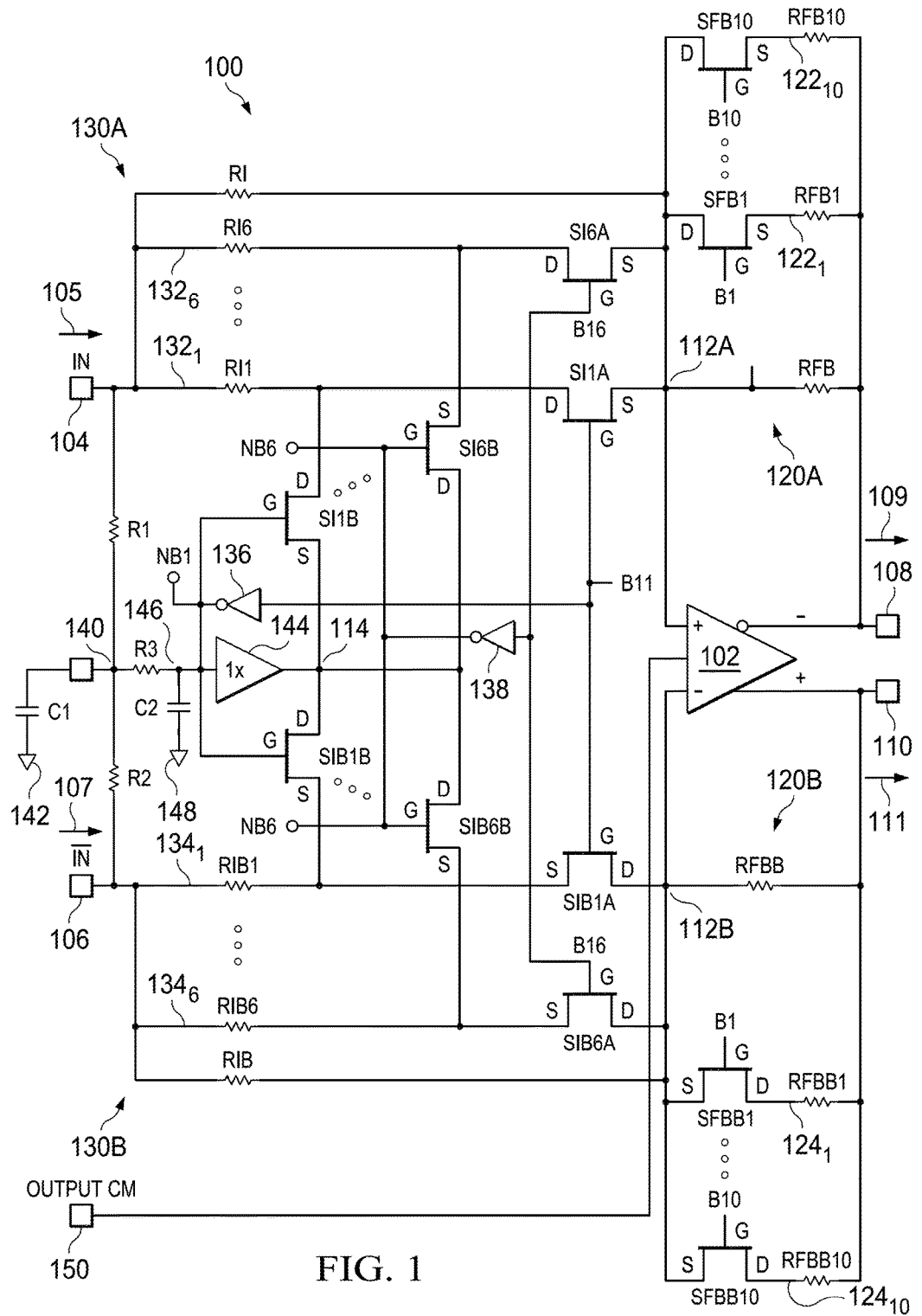
FIG. 1 is a schematic circuit diagram of an exemplary amplifier according to various aspects of the present disclosure.

In various implementations, an exemplary amplifier an input terminal; an output terminal; a first virtual ground node; a second virtual ground node; an operational amplifier coupled with the input terminal and the output terminal; a resistive input section coupled with an input of the operational amplifier; and a resistive feedback section coupled with an output of the operational amplifier. The resistive input section includes a fixed input resistor coupled with the input terminal and the first virtual ground node, and a switchable input resistor segment coupled with the fixed input resistor in parallel. The switchable input resistor segment includes an input resistor, a first input switch, and a second input switch, wherein the input resistor is coupled with the input terminal, the first virtual ground node via the first input switch, and the second virtual ground node via the second input switch. The resistive feedback section includes a fixed feedback resistor coupled with the output terminal and the first virtual ground node, and a switchable feedback resistor segment coupled with the fixed feedback resistor in parallel. The switchable feedback resistor segment includes a feedback resistor and a feedback switch, wherein the feedback resistor is coupled with the output terminal and the first virtual ground node via the feedback switch. The first input switch, the second input switch, and the feedback switch can be field effect transistors. The amplifier can be configured such that the second switch is in a first state when the first switch is in a second state and the second switch is in the second state when the first switch is in the first state. For example, the amplifier can further include an inverter coupled with the first input switch and the second input switch. In various implementations, the fixed input resistor is coupled with the first virtual ground node via a third input switch; and the fixed feedback resistor is coupled with the first virtual ground node via another feedback switch.

In various implementations, the amplifier includes a first voltage control terminal coupled with the first input switch; a second voltage control terminal coupled with the second switch; a voltage supply coupled with the first voltage control terminal and the second voltage control terminal, wherein the voltage supply is associated with an input common mode voltage of the input terminal. The voltage supply can further be coupled with the second virtual ground node. In various implementations, the first virtual ground node is coupled with one of an inverting input and a non-inverting output of the operational amplifier. In various implementations, the input terminal includes a first input terminal coupled with a non-inverting input of the operational amplifier; and a second input terminal coupled with an inverting input of the operational amplifier. The amplifier can further include a first resistor and a second resistor coupled with the first input terminal and the second input terminal in series. In various implementations, the amplifier further includes a buffer coupled with a junction node between the first resistor and the second resistor and the second virtual ground node.

In various implementations, an exemplary method for operating the amplifier includes setting a state of the first switch and the feedback switch to set a gain characteristic of the amplifier. The method can further include setting a state of the second switch based on the state of the first switch and/or setting a voltage drive level for the first switch and the second switch based on an input common mode voltage associated with the input terminal. In various implementations, where the fixed input resistor is coupled with the first virtual ground node via a third input switch and the fixed feedback resistor is coupled with the first virtual ground node via another feedback switch, the method can further include setting a state of the third input switch and another feedback switch, such that the third input switch and another feedback switch are in an ON state during operation of the amplifier.

In various implementations, a variable gain amplifier includes an input terminal; an output terminal; an operational amplifier coupled with the input terminal and the output terminal, wherein the operational amplifier has a non-inverting input, an inverting input, and an output; a first virtual ground node coupled with the non-inverting input; a second virtual ground node coupled with the inverting input; a third virtual ground node; a first resistive input section coupled with the input terminal and the non-inverting input; a second resistive input section coupled with the input terminal and the inverting input; a first resistive feedback section coupled with the non-inverting input and the output; and a second resistive feedback section coupled with inverting input and the output. The first resistive input section and the second resistive input section each include a fixed input resistor coupled with the input terminal and the first virtual ground node or the second virtual ground node, and at least one switchable input resistor segment coupled with the fixed input resistor in parallel, wherein the switchable input resistor segment includes an input resistor, a first input switch, and a second input switch, wherein the input resistor is coupled with the input terminal, the first virtual ground node or the second virtual ground node via the first input switch, and the third virtual ground node via the second input switch. The first resistive feedback section and the second resistive feedback section each include a fixed feedback resistor coupled with the output terminal and the first virtual ground node or the second virtual ground node, and a switchable feedback resistor segment coupled with the fixed feedback resistor in parallel, wherein the switchable feedback resistor segment includes a feedback resistor and a feedback switch, wherein the feedback resistor is coupled with the output terminal and the first virtual ground node or the second virtual ground node via the feedback switch.

In various implementations, the input terminal includes a first input terminal and a second input terminal, wherein the non-inverting input of the operational amplifier is coupled with the first input terminal and the inverting input of the operational amplifier is coupled with the second input terminal; the fixed input resistor and the input resistor of the first resistive feedback section are coupled with the first input terminal; and the fixed input resistor and the input resistor of the second resistive feedback section are coupled with the second input terminal. In various implementations, the output terminal includes a first output terminal and a second output terminal; the output of the operational amplifier includes a non-inverting output and an inverting input; the first resistive feedback section is coupled with the non-inverting output and the first output terminal; and the second resistive feedback section is coupled with the inverting output and the second output terminal.

The variable gain amplifier can further include a first resistor and a second resistor coupled with the first input terminal and the second input terminal in series. The variable gain amplifier can further include a buffer coupled with the third virtual ground node and a joint node between the first resistor and the second resistor. In various implementations, the variable gain amplifier further includes a first voltage control terminal, a second voltage control terminal, and a third voltage control terminal respectively coupled with the first input switch, the second input switch, and the feedback switch; and a voltage supply source associated with an input common mode voltage of the input terminal, wherein the voltage supply source is coupled with the first voltage control terminal, the second voltage control terminal, and the third voltage control terminal. The voltage supply source can be coupled with the third virtual ground node.

DETAILED DESCRIPTION OF EXAMPLE EMBODIMENTS

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed.

An amplifier increases a signal property (for example, current, voltage, power, other signal property, or a combination thereof) of an incoming signal, such as an electrical signal. An amplifier's gain indicates the ability of the amplifier to increase a power (or amplitude of the incoming signal from an input to an output. One type of amplifier is a variable gain amplifier, which can vary its gain depending on a control signal, such as a control voltage signal. The present disclosure provides various implementations of a variable gain amplifier (such as a DC coupled variable gain amplifier) that can reduce noise (even as gain decreases), maintain a constant input impedance as the gain changes, and/or minimize distortion. In various implementations, a resistive switching network uses switches (such as transistors) to lower the amplifier's noise while setting the gain. In various implementations, the amplifier's distortion is not degraded by a variable input common mode level by configuring the amplifier such that the switches' voltage drives (of the switches in the resistive switching network) are slaved to the input common mode level. Different embodiment many have different advantages, and no particular advantage is necessarily required of any embodiment.

Turning to FIG. 1, a schematic circuit diagram of an exemplary amplifier 100 is provided according to various aspects of the present disclosure. The amplifier 100 is an electronic device (including an electronic circuit and/or one or more components) configured to increase a signal property (for example, current, voltage, power, other signal property, or a combination thereof) of an incoming electrical signal. In the depicted embodiment, the amplifier 100 is a variable gain amplifier that can vary its gain depending on one or more control signals (voltages). FIG. 1 has been simplified for the sake of clarity to better understand the inventive concepts of the present disclosure. Additional features can be added in the amplifier 100, and some of the features described below can be replaced or eliminated in other embodiments of the amplifier 100.

The amplifier 100 includes an operational amplifier 102. The operational amplifier 102 is configured to amplify a difference between two voltage inputs. The operational amplifier 102 is coupled with the an input terminal and an output terminal, such that the operational amplifier 102 receives and amplifies a difference between input signals received from the input terminal according to a gain level set by the amplifier 100 to generate an output signal (an amplified signal) to the output terminal. As further described below, the amplifier 100 can vary the gain applied to the incoming signal. In the depicted embodiment, the operational amplifier 102 includes a differential input (a non-inverting input and an inverting input) and a differential output (a non-inverting output and an inverting output), such that the operational amplifier 102 is a fully differential amplifier. For example, the operational amplifier 102 is coupled with an input terminal 104 that receives an input signal 105 (in particular, the non-inverting input of the operational amplifier 102 is coupled with the input terminal 104), an input terminal 106 that receives an input signal 107 (in particular, the inverting input of the operational amplifier 102 is coupled with the input terminal 106), an output terminal 108 that receives an output signal 109 (in particular, the inverting output of the operational amplifier 102 is coupled with the output terminal 108), and an output terminal 110 that receives an output signal 111 (in particular, the non-inverting output of the operational amplifier 102 is coupled with the output terminal 110). Alternatively, the operational amplifier 102 has a single ended output, where the output of the operational amplifier 102 is coupled with a single output terminal.

The amplifier 100 further includes a virtual ground node 112A, a virtual ground node 112B, and a virtual ground node 114 maintain a steady reference potential ("nonmoving" voltage) with minimal voltage swing during operation of the amplifier 100. In the depicted embodiment, the virtual ground node 112A is coupled with the non-inverting input of the operational amplifier 102, and the virtual ground node 112B is coupled with the inverting input of the operational amplifier 102.

A resistive feedback section 120A is coupled with the output terminal 108 (and further with the inverting output of the operational amplifier 102) and the input (here, the non-inverting input) of the operational amplifier 102; and a resistive feedback section 120B is coupled with the output terminal 110 (and further with the non-inverting output of the operational amplifier 102) and the input (here, the inverting input) of the operational amplifier 102. In the depicted embodiment, resistive feedback section 120A is substantially similar to resistive feedback section 120B. For example, resistive feedback section 120A includes a fixed resistor RFB coupled with the output of the operational amplifier 102 (in the depicted embodiment, the inverting output) and the virtual ground node 112A, and resistive feedback section 120B includes a fixed resistor RFBB coupled with the output of the operational amplifier 102 (in the depicted embodiment, the non-inverting output) and the virtual ground node 112B. In furtherance of the example, resistive feedback section 120A includes at least one switchable feedback resistor segment, such as switchable feedback resistor segments $122_1$, $122_2$, ... $122_N$ (where N is a number of switchable feedback resistor segments in resistive feedback section 120A), coupled in parallel with fixed resistor RFB. Similarly, resistive feedback section 120B includes at least one switchable feedback resistor segment, such as switchable feedback resistor segments $124_1$, $124_2$, ... $124_n$ (where n is a number of switchable feedback resistor segments in resistive feedback section 120B), coupled in parallel with fixed resistor RFBB. The switchable feedback resistor segments $122_1$, $122_2$, ... $122_N$ include a respective feedback resistor RFB1, RFB2, ... RFBN and a respective feedback switch SFB1, SFB2, ... SFBN; and the switchable feedback resistor segments $124_1$, $124_2$, ... $124_n$ include a respective feedback resistor RFBB1, RFBB2, ... RFBBn and a respective feedback switch SFBB1, SFBB2, ... SFBBn. In the present example, the feedback switches (here, feedback switches SFB1, SFB2, ... SFBN and feedback switches SFBB1, SFBB2, ... SFBBN) are transistors that include a gate (G) interposed by a source (S) and a drain (D), such as field effect transistors (FETs). Alternatively or additionally, the feedback switches are implemented as junction gate field-effect transitors (JFETs), PIN diodes, other switching element, or combinations thereof.

In the depicted embodiment, resistive feedback section 120A and resistive feedback section 120B include ten switchable feedback resistor segments (N=n=10), such that resistive feedback section 120A includes switchable feedback resistor segments $122_1$, $122_2$, ... $122_{10}$, each segment having a respective feedback resistor RFB1, RFB2, ... RFB10 and a respective feedback switch SFB1, SFB2, ... SFB10; and resistive feedback section 120B includes switchable feedback resistor segments $124_1$, $124_2$, ... $124_{10}$, each segment having a respective feedback resistor RFBB1, RFBB2, ... RFBB10 and a respective feedback switch SFBB1, SFBB2, ... SFBB10. In the depicted embodiment, feedback resistors RFB1, RFB2, ... RFB10 are coupled with the inverting output of the operational amplifier 102 and the virtual ground node 112A via their respective feedback switch SFB1, SFB2, ... SFB10; and feedback resistors RFBB1, RFBB2, ... RFBB10 are coupled with the non-inverting output of the operational amplifier 102 and the virtual ground node 112B via their respective feedback switch SFBB1, SFBB2, ... SFBB10. For example, for switchable feedback resistor segment $122_1$, feedback resistor RFB1 is coupled with the inverting output of the operational amplifier 102 (and further with the output terminal 108) and the virtual ground terminal 112A via the feedback switch SFB1. Similarly, for switchable feedback resistor segment $124_1$, feedback resistor RFBB1 is coupled with the non-inverting output of the operational amplifier 102 (and further with the output terminal 110) and the virtual ground terminal 112B via the feedback switch SFBB1.

The amplifier 100 also includes a resistive input (feed forward) section 130A and a resistive input (feed forward) section 130B. The resistive input section 130A is coupled with the input terminal 104 and an input (here, the non-inverting input) of the operational amplifier 102, and the resistive input section 130B is coupled with the input terminal 106 and an input (here, the inverting input) of the operational amplifier 102. In the depicted embodiment, resistive input section 130A is substantially similar to resistive input section 130B. For example, resistive input section 130A includes a fixed input resistor RI coupled with the input terminal 104 and the virtual ground node 112A, and resistive input section 130B includes a fixed input resistor RIB coupled with the input terminal 106 and the virtual ground node 112B. In furtherance of the example, resistive input section 130A includes at least one switchable input resistor segment, such as switchable input resistor segments $132_1$, $132_2$, ... $132_M$ (where M is a number of switchable input resistor segments in resistive input section 130A), coupled in parallel with fixed input resistor RI. Similarly, resistive input section 130B includes at least one switchable input resistor segment, such as switchable input resistor segments $134_1$, $134_2$, ... $134_m$ (where m is a number of switchable input resistor segments in resistive input section 130B), coupled in parallel with fixed input resistor RIB. The switchable input resistor segments $132_1$, $132_2$, ... $132_M$ include a respective input resistor RI1, RI2, ... RIM, a respective input switch SI1A, SI2A, ... SIMA, and a respective input switch SI1B, SI2B, ... SIMB; and the switchable input resistor segments $134_1$, $134_2$, ... $134_m$ include a respective input resistor RIB1, RIB2, ... RIBn, a respective input switch SIB1A, SIB2A, ... SIBmA, and a respective input switch SIB1B, SIB2B, ... SIBmB. In the present example, the input switches (here, input switches SI1A, SI2A, ... SIMA; input switches SI1B, SI2B, ... SIMB; input switches SIB1A, SIB2A, ... SIBmA; and input switches SIB1B, SIB2B, ... SIBmB) are transistors that include a gate (G) interposed by a source (S) and a drain (D), such as field effect transistors (FETs). Alternatively or additionally, the input switches are implemented as junction gate field-effect transistors (JFETs), PIN diodes, other switching element, or combinations thereof.

In the depicted embodiment, resistive input section 130A and resistive input section 130B include six switchable input resistor segments (M=m=6), such that resistive input section 130A includes switchable input resistor segments $132_1$, $132_2$, ... $132_6$, each segment having a respective input resistor RI1, RI2, ... RI6, a respective input switch SI1A, SI2A, ... SI6A, and a respective input switch SI1B, SI2B, ... SI6B; and resistive input section 130B includes switchable input resistor segments $134_1$, $134_2$, ... $134_6$, each segment having a respective input resistor RIB1, RIB2, ... RIB6, a respective input switch SIB1A, SIB2A, ... SIB6A, and a respective input switch SIB1B, SIB2B, ... SIB6B. In the depicted embodiment, input resistors RI1, RI2, ... RI6 are coupled with the input terminal 104, the virtual ground node 112A via their respective input switch SI1A, SI2A, ... SI6A, and the virtual ground node 114 via their respective input switch SI1B, SI2B, . . . SI6B; and input resistors RIB1, RIB2, . . . RIB6 are coupled with the input terminal 106, the virtual ground node 112B via their respective input switch SIB1A, SIB2A, . . . SIB6A, and the virtual ground node 114 via their respective input switch SIB1B, SIB2B, . . . SIB6B. For example, for switchable feedback resistor segment $132_1$, input resistor RI1 is coupled with the input terminal 104, the virtual ground terminal 112A via the input switch SI1A, and the virtual ground terminal 114 via the input switch SI1B. Similarly, for switchable input resistor segment $134_1$, input resistor RIB1 is coupled with the input terminal 106, the virtual ground terminal 112B via the input switch SIB1A, and the virtual ground terminal 114 via the input switch SIB1B.

Voltage control terminals B1, B2, . . . BX (where X is a total number of feedback switches and input switches coupled with an input of the operational amplifier 102 (such as the non-inverting input or inverting input of the operational amplifier 102), or alternatively, coupled with virtual ground node 112A or virtual ground node 112B) are coupled with input switches SI1A, SI2A, . . . SIMA; input switches SIB1A, SIB2A, . . . SIBmA; feedback switches SFB1, SFB2, . . . SFBN; and/or feedback switches SFBB1, SFBB2, . . . SFBBN. In the depicted embodiment, where there are sixteen switches coupled with the voltage control terminal 112A (input switches SI1A, SI2A, . . . SI6A and feedback switches SFB1, SFB2, . . . SFBB10) and the voltage control terminal 112B (input switches SIB1A, SIB2A, . . . SIB6A and feedback switches SFBB1, SFBB2, . . . SFBB10), the amplifier 100 includes voltage control terminals B1, B2, . . . B16 coupled with the input switches and the feedback switches. For example, voltage control terminal B1 is coupled with feedback switch SFB1 and feedback switch SFBB1, voltage control terminal B10 is coupled with feedback switch SFB10 and feedback switch SFBB10, voltage control terminal B11 is coupled with input switch SI1A and input switch SIB1A, and voltage control terminal B16 is coupled with input switch SI6A and input switch SIB6A.

Voltage control terminals NB1, NB2, . . . NBx (where x is a total number of switchable input resistor segments coupled with an input of the operational amplifier) are respectively coupled with input switches SI1B, SI2B, . . . SIMB and input switches SIB1B, SIB2B, . . . SIBmB. In the depicted embodiment, where there are six switchable input resistor segments coupled with the voltage control terminal 112A (switchable input resistor segments $132_1$, $132_2$, . . . $132_6$) and the voltage control terminal 112B (switchable input resistor segments $134_1$, $134_2$, . . . $134_6$), the amplifier 100 includes voltage control terminals NB1, NB2, . . . NB6 (where x=6) coupled with input switches SI1B, SI2B, . . . SI6B and input switches SIB1B, SIB2B, . . . SIB6B. For example, voltage control terminal NB1 is coupled with input switch SI1B and input switch SIB1B, and voltage control terminal NB6 is coupled with input switch SI6B and input switch SIB6B.

In operation, an equivalent resistance of resistive feedback section 120A can be varied to change the gain of the amplifier 100. For example, to change the equivalent resistance of the resistive feedback section 120A, feedback switches SFB1, SFB2, . . . SFBN are configured to switch their associated feedback resistor RFB1, RFB2, . . . RFBN in (and out of) parallel with the fixed feedback resistor RFB. By switching one or more of the feedback resistors RFB1, RFB2, . . . RFBN in parallel with the fixed feedback resistor RFB, the amplifier 100 lowers the equivalent resistance of the resistive feedback section 120A, thereby decreasing the gain of the amplifier. In the depicted embodiment, the gates of feedback switches SFB1, SFB2, . . . SFB10 are respectively coupled with voltage control terminals B1, B2, . . . B10, such that a state of feedback switches SFB1, SFB2, . . . SFB10 is controlled by a voltage control signal received via the respective voltage control terminals B1, B2, . . . B10. The voltage control signals are control (drive) voltages that turn the feedback switches SFB1, SFB2, . . . SFB10 to an ON state or an OFF state, where an ON state places the switch's associated feedback resistor RFB1, RFB2, . . . RFB6 in parallel with the fixed feedback resistor RFB. Similarly, an equivalent resistance of resistive feedback section 120B can be varied to change the gain of the amplifier 100. For example, to change the equivalent resistance of the resistive feedback section 120B, feedback switches SFBB1, SFBB2, . . . SFBBN are configured to switch their associated feedback resistor RFBB1, RFBB2, . . . RFBBN in (and out of) parallel with the fixed feedback resistor RFBB. By switching one or more of the feedback resistors RFBB1, RFBB2, . . . RFBBN in parallel with the fixed feedback resistor RFBB, the amplifier 100 lowers the equivalent resistance of the resistive feedback section 120B while decreasing the gain and decreasing output noise. In the depicted embodiment, the gates of feedback switches SFBB1, SFBB2, . . . SFBB10 are respectively coupled with voltage control terminals B1, B2, . . . B10, such that a state of feedback switches SFBB1, SFBB2, . . . SFBB10 is controlled by a voltage control signal (also referred to as a voltage ramp) received via the respective voltage control terminals B1, B2, . . . B10. The voltage control signals are control (drive) voltages that turn the feedback switches SFBB1, SFBB2, . . . SFBB10 to an ON state or an OFF state, where an ON state places the switch's associated feedback resistor RFBB1, RFBB2, . . . RFBB6 in parallel with the fixed feedback resistor RFBB.

In contrast to conventional amplifier configurations (for example, a conventional variable gain input R-NR attenuator amplifier), where an output noise level of the amplifier remains constant as the gain decreases, the amplifier 100 decreases the output noise while decreasing the gain by configuring the resistive feedback section 120A with the fixed feedback resistor RFB in parallel with the switchable feedback resistor segments $122_1$, $122_2$, . . . $122_N$ and the resistive feedback section 120B with the fixed feedback resistor RFBB in parallel with the switchable feedback resistor segments $122_1$, $122_2$, . . . $122_n$. Alternatively, the amplifier 100 can be configured to switch resistors in place of the fixed feedback resistor RFB (and/or fixed feedback resistor RFBB), in which case the fixed feedback resistor (and/or fixed feedback resistor RFBB) is also coupled with a switch, such that the fixed feedback resistor can be switched in (and out of) the resistive feedback section 120A (and/or resistive feedback section 120B). Though such configuration can also decrease the output noise while decreasing the gain, resistor values in this configuration typically have lower values than the resistor values in the depicted embodiment (where a fixed resistor can be placed in parallel with one or more resistors via switching), which necessitates larger switch sizes, thereby leading to increased area overhead and associated capacitance. The increased capacitance can lead to increased distortion, which can reduce operating stability of the amplifier 100. The depicted configuration of the amplifier 100 thus optimizes decreasing the output noise while decreasing the gain.

In amplifier 100, an equivalent resistance of resistive input section 130A can also be varied to change the gain of the amplifier 100. For example, to change the equivalent resistance of the resistive input section 130A, input switches SI1A, SI2A, . . . SIMA are configured to switch their associated input resistor RI1, RI2, . . . RIM in (and out of) parallel with the fixed input resistor RI. By switching one or more of the input resistors RI1, RI2, . . . RIM in parallel with the fixed input resistor RI, the amplifier 100 lowers the equivalent resistance of the resistive input section 130A, thereby increasing the gain of the amplifier. In the depicted embodiment, the gates of input switches SI1A, SI2A, . . . SI6A are respectively coupled with voltage control terminals B11, B12, . . . B16, such that a state of input switches SI1A, SI2A, . . . SI6A is controlled by a voltage control signal received via the respective voltage control terminals B11, B12, . . . B16. The voltage control signals are control (drive) voltages that turn the input switches SI1A, SI2A, . . . SI6A to an ON state or an OFF state, where an ON state places the switch's associated input resistor RI1, RI2, . . . RI6 in parallel with the fixed input resistor RI. Similarly, an equivalent resistance of resistive input section 130B is varied to change the gain of the amplifier 100. For example, to change the equivalent resistance of the resistive input section 130B, input switches SIB1A, SIB2A, . . . SIBmA are configured to switch their associated input resistor RIB1, RIB2, . . . RIBm in (and out of) parallel with the fixed input resistor RIB. By switching one or more of the input resistors RIB1, RIB2, . . . RIBm in parallel with the fixed input resistor RIB, the amplifier 100 lowers the equivalent resistance of the resistive input section 130B, thereby increasing the gain. In the depicted embodiment, the gates of input switches SIB1A, SIB2A, . . . SIB6A are respectively coupled with voltage control terminals B11, B12, . . . B16, such that a state of input switches SIB1A, SIB2A, . . . SIB6A is controlled by a voltage control signal received via the respective voltage control terminals B11, B12, . . . B16. The voltage control signals are control (drive) voltages that turn the input switches SIB1A, SIB2A, . . . SIB6A to an ON state or an OFF state, where an ON state places the switch's associated input resistor RIB1, RIB2, . . . RIB6 in parallel with the fixed input resistor RIB.

By implementing one or more switchable input resistor segments in resistive input section 130A and resistive input section 130B, the amplifier 100 reduces the number of resistors necessary in the feedback network (here, resistive feedback section 120A and resistive feedback section 120B). For example, if the amplifier 100 was configured without resistive input section 130A and resistive input section 130B, to achieve a 20 db gain amplifier with 4 dB gain steps, resistive feedback section 120A would need the fixed feedback resistor RFB and five switchable feedback resistor segments (N=5), and resistive feedback section 120B would need the fixed feedback resistor RFBB and five switchable feedback resistor segments (n=5). To achieve the 20 db gain amplifier 2 dB gain steps, resistive feedback section 120A and resistive feedback section 120B would need double the number of switchable feedback resistor segments (N=n=10), for a total of 20 switchable feedback resistor segment. To achieve the 20 db gain amplifier with 1 dB gain steps, resistive feedback section 120A and resistive feedback section 120B would again double the number of switchable feedback resistor segments (N=n=20), for a total of 40 switchable feedback resistor segments. In the depicted embodiment, to reduce the number of switchable feedback resistor segments in a 20 db gain amplifier with 1 dB gain steps, the amplifier 100 is configured such that each switchable feedback resistor segment (in resistive feedback segment 120A and resistive feedback segment 120B) represent a 2 dB gain step. The resistive feedback segment 120A is then interpolated with the resistive input section 130A, and the resistive feedback segment 120B is then interpolated with resistive input section 130B, where each switchable input resistor segment (in resistive input segment 130A and resistive input segment 130B) represents a 1 dB step. The amplifier 100 thus necessities ten switchable feedback resistor segments for resistive feedback section 120A and resistive feedback section 120B (N=n=10) as opposed to twenty when using conventional amplifier configurations. Accordingly, the amplifier 100 reduces the number of feedback resistors as well as the number of associated switches. The depicted configuration of the amplifier 100 further achieves negative gain levels by implementing the one or more switchable input resistor segments in resistive input section 130A and resistive input section 130B. Table 1 below gives various gains achievable by the amplifier 100 as depicted by using the voltage control terminals B1, B2, . . . B16 to set respective switches to the ON state (represented by 1) or the OFF state (represented by 0), where each switchable input resistor segments (in resistive input segment 130A and resistive input segment 130B) represents a 1 dB step and each switchable feedback resistor segment (in resistive feedback segment 120A and resistive feedback segment 120B) represents a 2 dB gain step.

| Gain | B1 | B2 | B3 | B4 | B5 | B6 | B7 | B8 | B9 | B10 | B11 | B12 | B13 | B14 | B15 | B16 |
|---|---|---|---|---|---|---|---|---|---|---|---|---|---|---|---|---|
| −6 | 1 | 1 | 1 | 1 | 1 | 1 | 1 | 1 | 1 | 1 | 0 | 0 | 0 | 0 | 0 | 0 |
| −5 | 1 | 1 | 1 | 1 | 1 | 1 | 1 | 1 | 1 | 1 | 0 | 0 | 0 | 0 | 0 | 1 |
| −4 | 1 | 1 | 1 | 1 | 1 | 1 | 1 | 1 | 1 | 1 | 0 | 0 | 0 | 0 | 1 | 1 |
| −3 | 1 | 1 | 1 | 1 | 1 | 1 | 1 | 1 | 1 | 1 | 0 | 0 | 0 | 1 | 1 | 1 |
| −2 | 1 | 1 | 1 | 1 | 1 | 1 | 1 | 1 | 1 | 1 | 0 | 0 | 1 | 1 | 1 | 1 |
| −1 | 1 | 1 | 1 | 1 | 1 | 1 | 1 | 1 | 1 | 1 | 0 | 1 | 1 | 1 | 1 | 1 |
| 0 | 1 | 1 | 1 | 1 | 1 | 1 | 1 | 1 | 1 | 1 | 1 | 1 | 1 | 1 | 1 | 1 |
| 1 | 1 | 1 | 1 | 1 | 1 | 1 | 1 | 1 | 1 | 0 | 0 | 1 | 1 | 1 | 1 | 1 |
| 2 | 1 | 1 | 1 | 1 | 1 | 1 | 1 | 1 | 1 | 0 | 1 | 1 | 1 | 1 | 1 | 1 |
| 3 | 1 | 1 | 1 | 1 | 1 | 1 | 1 | 0 | 0 | 0 | 1 | 1 | 1 | 1 | 1 | 1 |
| 4 | 1 | 1 | 1 | 1 | 1 | 1 | 1 | 0 | 0 | 1 | 1 | 1 | 1 | 1 | 1 | 1 |
| 5 | 1 | 1 | 1 | 1 | 1 | 1 | 0 | 0 | 0 | 0 | 1 | 1 | 1 | 1 | 1 | 1 |
| 6 | 1 | 1 | 1 | 1 | 1 | 1 | 0 | 0 | 0 | 1 | 1 | 1 | 1 | 1 | 1 | 1 |
| 7 | 1 | 1 | 1 | 1 | 1 | 0 | 0 | 0 | 0 | 0 | 1 | 1 | 1 | 1 | 1 | 1 |
| 8 | 1 | 1 | 1 | 1 | 1 | 0 | 0 | 0 | 0 | 1 | 1 | 1 | 1 | 1 | 1 | 1 |
| 9 | 1 | 1 | 1 | 1 | 1 | 0 | 0 | 0 | 0 | 0 | 1 | 1 | 1 | 1 | 1 | 1 |
| 10 | 1 | 1 | 1 | 1 | 0 | 0 | 0 | 0 | 0 | 1 | 1 | 1 | 1 | 1 | 1 | 1 |
| 11 | 1 | 1 | 1 | 1 | 0 | 0 | 0 | 0 | 0 | 0 | 1 | 1 | 1 | 1 | 1 | 1 |
| 12 | 1 | 1 | 1 | 1 | 0 | 0 | 0 | 0 | 0 | 1 | 1 | 1 | 1 | 1 | 1 | 1 |
| 13 | 1 | 1 | 1 | 0 | 0 | 0 | 0 | 0 | 0 | 0 | 1 | 1 | 1 | 1 | 1 | 1 |
| 14 | 1 | 1 | 1 | 0 | 0 | 0 | 0 | 0 | 0 | 1 | 1 | 1 | 1 | 1 | 1 | 1 |
| 15 | 1 | 1 | 0 | 0 | 0 | 0 | 0 | 0 | 0 | 0 | 1 | 1 | 1 | 1 | 1 | 1 |

-continued

| Gain | B1 | B2 | B3 | B4 | B5 | B6 | B7 | B8 | B9 | B10 | B11 | B12 | B13 | B14 | B15 | B16 |
|---|---|---|---|---|---|---|---|---|---|---|---|---|---|---|---|---|
| 16 | 1 | 1 | 0 | 0 | 0 | 0 | 0 | 0 | 0 | 0 | 1 | 1 | 1 | 1 | 1 | 1 |
| 17 | 1 | 0 | 0 | 0 | 0 | 0 | 0 | 0 | 0 | 0 | 0 | 1 | 1 | 1 | 1 | 1 |
| 18 | 1 | 0 | 0 | 0 | 0 | 0 | 0 | 0 | 0 | 0 | 1 | 1 | 1 | 1 | 1 | 1 |
| 19 | 0 | 0 | 0 | 0 | 0 | 0 | 0 | 0 | 0 | 0 | 0 | 1 | 1 | 1 | 1 | 1 |
| 20 | 0 | 0 | 0 | 0 | 0 | 0 | 0 | 0 | 0 | 0 | 1 | 1 | 1 | 1 | 1 | 1 |

Alternatively, the amplifier 100 can configure resistive feedback section 120A and resistive feedback section 120B to achieve negative gain levels. Such configurations typically necessitate a smaller size for the feedback resistors, which can increase the amplifier's power, yet also increase distortion.

Further, in conventional amplifier configurations, as the input resistors RI1, RI2, . . . RIM are switched in (and out) of parallel with the fixed input resistor RI by their associated input switch SI1A, SI2A, . . . SIMA and the input resistors RIB1, RIB2, . . . RIBm are switched in (and out) of parallel with the fixed input resistor RIB by their associated input switch SIB1A, SIB2A, . . . SIBMA to change the amplifier's gain, an input impedance of the amplifier also undesirably changes. These input impedance changes are particularly undesirable in high frequency applications. To address such issues, the amplifier 100 is configured so that the input resistors RI1, RI2, . . . RIM and the input resistors RIB1, RIB2, . . . RIBm remain coupled with (connected to) a nonmoving voltage or "ground" (such as a virtual ground node or an integrated input DC level), thereby allowing the amplifier 100 to maintain a constant input impedance even as the gain of the amplifier 100 changes. For example, as described above, in resistive input section 130A, input resistors RI1, RI2, . . . RIM are also coupled with a respective input switch SI1B, SI2B, . . . SIMB. The input switches SI1B, SI2B, . . . SIMB are configured to switch their associated input resistor RI1, RI2, . . . RIM in (and out of) coupling (connection) with the virtual ground node 114. Similarly, in resistive input section 130B, input resistors RIB1, RIB2, . . . RIBm are also coupled with a respective input switch SIB1B, SIB2B, . . . SIBmB, and the input switches SIB1B, SIB2B, . . . SIBmB are configured to switch their associated input resistor RIB1, RIB2, . . . RIBm in (and out of) coupling (connection) with the virtual ground node 114. Accordingly, in operation, when the input resistors RI1, RI2, . . . RIM are switched out of parallel with the fixed input resistor RI (and thereby out of the input resistive circuit) and/or the input resistors RIB1, RIB2, . . . RIBm are switched out of parallel with the fixed input resistor RIB (and thereby out of the input resistive circuit), such input resistors RI1, RI2, . . . RIM and/or input resistors RIB1, RIB2, . . . RIBm are coupled with the virtual ground node 114 via their respective input switches SI1B, SI2B, . . . SIMB and respective input switches SIB1B, SIB2B, . . . SIBmB, thereby changing the gain while maintaining the input impedance.

In the depicted embodiment, the gates of input switches SI1B, SI2B, . . . SI6B and the gates of input switches SIB1B, SIB2B, . . . SIB6B are respectively coupled with voltage control terminals NB1, NB2, . . . NB6, such that a state of input switches SI1B, SI2B, . . . SI6B and input switches SIB1B, SIB2B, . . . SIB6B is controlled by a voltage control signal received via the respective voltage control terminals NB1, NB2, . . . NB6. The voltage control signals are control (drive) voltages that turn the input switches SI1B, SI2B, . . . SI6B and input switches SIB1B, SIB2B, . . . SIB6B to an ON state or an OFF state, where an ON state couples the switch's associated input resistor RI1, RI2, . . . RI6 and/or input resistor RIB1, RIB2, . . . RIB6 with the virtual ground node 114. In the present example, the virtual ground node 114 is a common mode ground (in particular, an integrated voltage of the two inputs in the depicted differential configuration). The input impedance at the inputs of the amplifier 100 thus remains a same value regardless of the gain.

The amplifier 100 can implement an inverter coupled with an input resistor's associated switch pair, where the inverter is configured to change a state of one switch from a first state to a second state (such as from an OFF state to an ON state) while changing a state of another switch from the second state to the first state (such as from the ON state to the OFF state), and vice versa. The inverter can achieve a signal at one switch of the associated switch pair (such as switch SI1A and/or switch SIB1A) that is an inverse of a signal at the other switch of the associated switch pair (such as switch SI1B and/or switch SIB1B). The associated input resistor can be a shunt or series resistor depending on how it is switched. In the depicted embodiment, the amplifier 100 includes an inverter 136 coupled with the switch pair associated with the input resistor RI1 (switch SI1A and switch SI1B) and the switch pair associated with the input resistor RIB1 (switch SIB1A and switch SIB1B); and the amplifier 100 includes an inverter 138 coupled with the switch pair associated with the input resistor RI6 (switch SI6A and switch SI6B) and the switch pair associated with the input resistor RIB6 (switch SIB6A and switch SIB6B). In particular, the inverter 136 is coupled with a gate of switch SI1A, a gate of switch SI1B, a gate of switch SIB1A, and a gate of switch SIB1B; and the inverter 138 is coupled with a gate of switch SI6A, a gate of switch SI6B, a gate of switch SIB6A, and a gate of switch SIB6B. Accordingly, in operation, when the switch SI1A is in an ON state to couple the input resistor RI1 in parallel with the fixed input resistor RI (and thus couple the input resistor RI1 with the virtual ground node 112A), the switch SI1B is in an OFF state; and when the switch SI1B is in an ON state to couple the input resistor RI1 with the virtual ground node 114, the switch SI1A is in an OFF state. Similarly, when the switch SIB1A is in an ON state to couple the input resistor RIB1 in parallel with the fixed input resistor RIB (and thus couple the input resistor RIB1 with the virtual ground node 112B), the switch SIB1B is in an OFF state; when the switch SIB1B is in an ON state to couple the input resistor RIB1 with the virtual ground node 114, the switch SIB1A is in an OFF state. With respect to the switch pair associated with the input resistor RI6 (switch SI6A and switch SI6B) and the switch pair associated with the input resistor RIB6 (switch SIB6A and switch SIB6B), in operation, when the switch SI6A is in an ON state to couple the input resistor RI6 in parallel with the fixed input resistor RI (and thus couple the input resistor RI6 with the virtual ground node 112A), the switch SI6B is in an OFF state; and when the switch SI6B is in an ON state to couple the input resistor RI6 with the virtual ground node 114, the switch SI6A is in an OFF state. Similarly, when the switch SIB6A is in an ON state to couple the input resistor RIB6 in parallel with the fixed input resistor RIB (and thus couple the input resistor RIB6 with the virtual ground node 112B), the switch SIB6B is in an OFF state; when the switch SIB6B is in an ON state to couple the input resistor RIB6 with the virtual ground node 114, the switch SIB6A is in an OFF state.

The amplifier 100 further includes a resistor R1 and a resistor R2 that integrate the input terminal 104 and the input terminal 106. In the depicted embodiment, resistor R1 and resistor R2 are coupled in series between the input terminal 104 and the input terminal 106: resistor R1 is coupled with the input terminal 104, resistor R2 is coupled with the input terminal 106, and resistor R1 is coupled with resistor R2 at junction node 140. Resistor R1 and resistor R2 are configured to reduce any mismatch between signals received at input terminal 104 and input terminal 106 (such as input signal 105 and input signal 107). In various implementations, the joint node 140 is coupled with a ground terminal 142 via a capacitor C1, such that a voltage at the joint node 140 (center voltage) can be integrated via capacitor C1 to ensure that mismatches between the two input terminals can be reduced from generating a DC level. Resistor R1 and resistor R2 are further configured such that their respective values do not change (or minimally change) the input impedance of the amplifier 100. In various implementations, resistor R1 and resistor R2 have values large enough to be negligible for impedance purposes. In various implementations, resistor R1 and resistor R2 have values when in parallel with the input resistors to achieve an equivalent resistance of the resistive input section that equals a desired, specified input impedance.

The amplifier 100 can further implement a buffer amplifier 144, such as a unity gain buffer, that is coupled with the virtual ground node 114. In the present example, the buffer amplifier 144 is further coupled with the joint node 140 between resistor R1 and resistor R2. The buffer amplifier 144 is configured to ensure that virtual ground node 114 remains at the common mode voltage of the two inputs (input terminal 104 and input terminal 106). In various implementations, the buffer amplifier 144 can isolate the input signal 105 (from the input terminal 104) from the input signal 107 (from the input terminal 106) if the input signal 105 is not well matched with the input signal 107. In various implementations, the buffer amplifier 144 can be coupled with the joint node 140 via a resistor R3, and/or a capacitor C2 can be coupled with the buffer amplifier 144 and the resistor R3 at a node 146 (the capacitor C2 can further be coupled with a ground node 148).

In furtherance of the depicted embodiment, to reduce distortion, all switches in the amplifier 100 are coupled with a virtual ground (such as a virtual ground of the operational amplifier 102 (for example, virtual ground node 112A and/or virtual ground node 112B) and/or common mode node of the amplifier 100 (for example, virtual ground node 114)), as described above. Coupling input switches SI1A, SI2A, . . . SIMA with the virtual ground 112A, input switches SIB1A, SIB2A, . . . SIBmA with the virtual ground node 112B, feedback switches SFB1, SFB2, . . . SFBN with the virtual ground node 112A, and feedback switches SFBB1, SFBB2, . . . SFBBN with the virtual ground node 112B ensures that any of these switches in an ON state has a minimal voltage (for example, AC voltage) across it. Such arrangement minimizes any distortion from the switches that can arise from the input signal (here, input signal 105 and input signal 107) and output signal (here, output signal 108 and output signal 110) of the amplifier 100. In particular, considering feedback switch SFB1, when in an OFF state, one terminal (here, the drain) of the switch SFB1 has little movement, and one terminal (here, the source) moves with the output of the amplifier 100 (since the source is connected to the output through a series feedback resistor). This network configuration acts as a small capacitor in series with a resistor connected to the output, such that when the switch is in the OFF state, its channel resistance is very high and thus adds very little loading on the output of the amplifier 100. When in an ON state, one terminal (here, the drain) is coupled with the virtual ground node 112 so that it does not move (first order). Since a resistance in a channel of the switch SFB1 (source/drain channel is relatively low when the switch is in the ON state, the other terminal (here, the source) also moves very little. The minimal movement at the terminals of the switch SFB1 means that an on resistance of the switch SFB1 changes very little when the output of the amplifier 100 has large voltage swings. Thus, any distortion arising from variations in the switch SFB1's capacitance and channel resistance is minimal. Further, considering input switch SI1A, when in an OFF state, its associated switch SI1B is in an ON state coupled with virtual ground 114, such that a junction between switch SI1A and switch SI1B is at the common mode voltage of virtual ground node 114. Accordingly, if both terminals of the switch SI1B are coupled to a DC voltage, no AC modulation of the switch SI1B arises that can cause distortion. Such phenomenon applies to the other switches coupled with the virtual ground node 112A and virtual ground node 112B, and applies to switches that are coupled with the virtual ground node 114. For example, at any time, a minimal voltage (for example, AC voltage) also arises across input switches SI1B, SI2B, . . . SIMB and input switches SIB1B, SIB2B, . . . SIBmB coupled with the virtual ground node 114 (in the depicted embodiment, the common mode ground node). When any of input switches SI1B, SI2B, . . . SIMB and input switches SIB1B, SIB2B, . . . SIBmB is in an ON state, its signal is divided down by the feed forward resistance (from resistor RI; resistors RI1, RI2, . . . RIM; resistor RIB; and/or resistors RIB1, RIB2, . . . RIBm) and its internal on resistance. And, when any of input switches SI1B, SI2B, . . . SIMB and input switches SIB1B, SIB2B, . . . SIBmB are in an OFF state, it is coupled with a virtual ground of the operational amplifier 102 (for example, virtual ground node 112A and/or virtual ground node 112B) via its associated input switch SI1A, SI2A, . . . SIMA and/or associated input switch SIB1A, SIB2A, . . . SIBmA.

Figure 2:
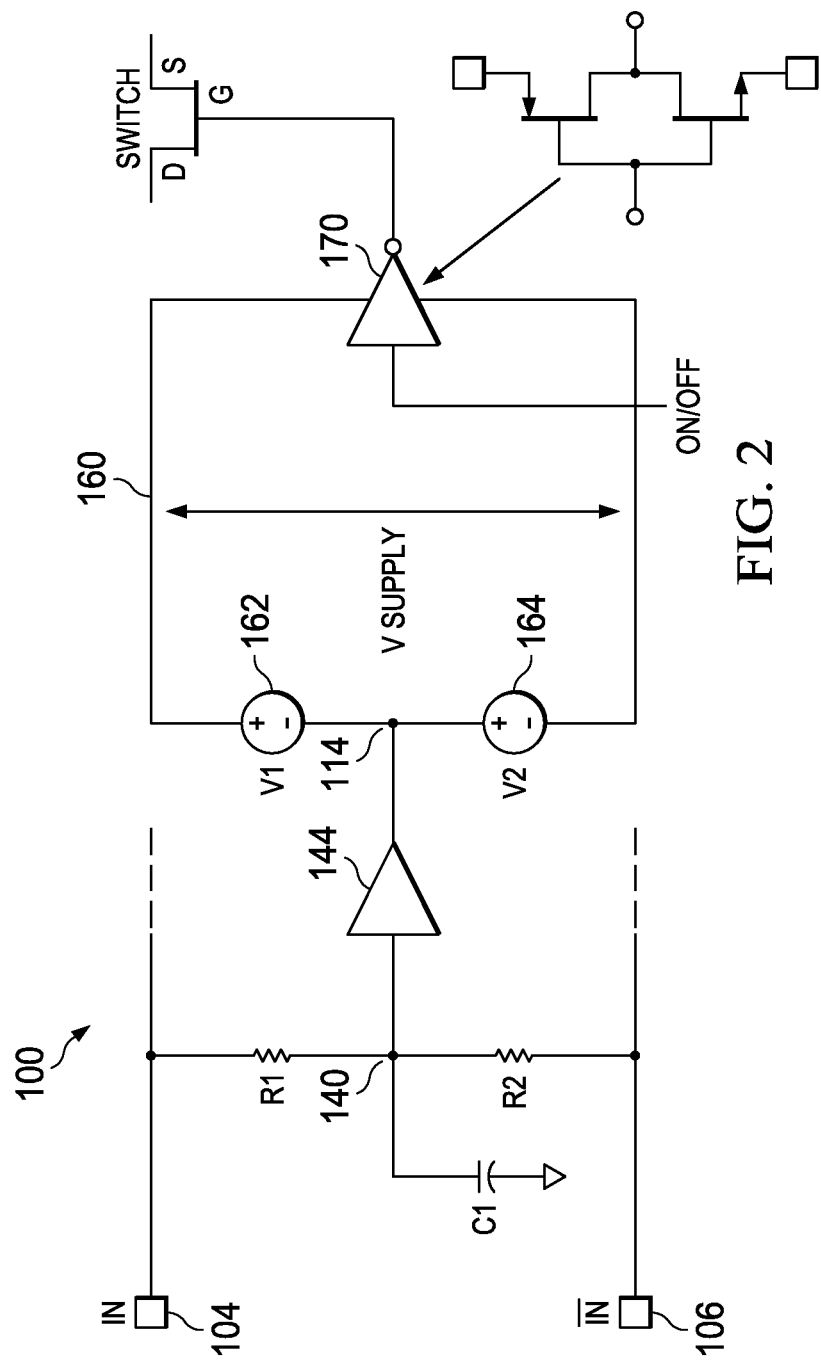
FIG. 2 is a schematic circuit diagram of a portion of the exemplary amplifier of FIG. 1 according to various aspects of the present disclosure.

To further reduce distortion, the amplifier 100 is further configured to slave voltage drive levels to the amplifier's switches (here, input switches SI1A, SI2A, . . . SIMA; input switches SIB1A, SIB2A, . . . SIBmA; input switches SI1B, SI2B, . . . SIMB; input switches SIB1B, SIB2B, . . . SIBmB; feedback switches SFB1, SFB2, . . . SFBN; and feedback switches SFBB1, SFBB2, . . . SFBBN) to an input common mode voltage of the input terminals (here, input terminal 104 and input terminal 106). In the depicted embodiment, a voltage at the virtual ground node 114 (the common mode ground between the input terminal 104 and the input terminal 106) can serve as the reference input common mode voltage, such that the voltage control terminals B1, B2, . . . BN and/or the voltage control terminals NB1, NB2, . . . NBx (which provide the voltage drive levels to the gates of the switches) are slaved to the virtual ground node 114. Turning to FIG. 2, a schematic circuit diagram of a portion of the exemplary amplifier 100 of FIG. 1 that illustrates a configuration for setting a voltage range (voltage drive level range) for the switches according to various aspects of the present disclosure. In FIG. 2, the virtual ground node is further coupled with a voltage supply 160 having a voltage source 162 and a voltage source 164. The voltage source 162 and the voltage source 164 set a voltage drive level range for the switches (here, input switches SI1A, SI2A, ... SIMA; input switches SIB1A, SIB2A, ... SIBmA; input switches SI1B, SI2B, ... SIMB; input switches SIB1B, SIB2B, ... SIBmB; feedback switches SFB1, SFB2, ... SFBN; and feedback switches SFBB1, SFBB2, ... SFBBN). In various implementations, an inverter 170 can be coupled with the voltage supply 160 and one of the switches (input switches SI1A, SI2A, ... SIMA; input switches SIB1A, SIB2A, ... SIBmA; input switches SI1B, SI2B, ... SIMB; input switches SIB1B, SIB2B, ... SIBmB; feedback switches SFB1, SFB2, ... SFBN; and feedback switches SFBB1, SFBB2, ... SFBBN), such that the voltage supply 160 can set the voltage drive levels of the switch. For example, if 3.0 V switches are implemented in the amplifier 100, the voltage source 162 and the voltage source 164 can each supply ±1.5 V, such that a 1.5 V level can be added above and/or below the input common mode voltage (here, the common mode voltage at virtual ground node 114). The voltage control signals that drive the switches (via the voltage control terminals B1, B2, ... BN and/or the voltage control terminals NB1, NB2, ... NBx) will then track the integrated common mode DC levels of the input signals (here, input signal 105 via input terminal 104 and input signal 107 via input terminal 106), such that overdrive levels on the switches can be maintained by the amplifier 100 and such that the ON/OFF voltages associated with the switches can be translated to ensure appropriate switching. Accordingly, if the DC offset of each input signal move up, the voltage drive signals to the switches will also move up. Because such DC offsets are not added to the gate level of the switches, the switches can have relatively smaller dimensions, as opposed to higher voltage FET switches. Slaving the switches' voltage drive levels to the input common node voltage also reduces the switches' on resistance and junction capacitance, thereby reducing distortion and improving the amplifier 100's operating stability.

The description and drawings are, accordingly, to be regarded in an illustrative rather than a restrictive sense. For example, the specifications, dimensions, and relationships outlined herein have only been offered for purposes of example and teaching only. Each of these may be varied considerably without departing from the spirit of the present disclosure, or the scope of the appended claims. The specifications apply only to non-limiting examples and, accordingly, they should be construed as such. In the foregoing description, example embodiments have been described with reference to particular component arrangements. Various modifications and changes may be made to such embodiments without departing from the scope of the appended claims. For example, the present disclosure contemplates amplifier configurations where resistive feedback section 120A differs from resistive feedback section 120B, resistive input section 130A differs from the resistive input section 130B, resistive feedback section 120A and/or resistive feedback section 120B may differ than that depicted in the FIGURES, and/or resistive input section 130A and/or resistive input section 130B may differ than that depicted in the FIGURES. For example, different numbers, sizes, and/or configurations of fixed input resistors, fixed feedback resistor, switchable input resistor segment, and switchable feedback resistor segments may be implemented depending on design requirements of the amplifier. The present disclosure further contemplates implementations where the fixed input resistors and/or the fixed feedback resistors are coupled with switches, such as coupled with the virtual ground nodes via switches (in some embodiments, similar to the switchable input resistor segments and/or the switchable feedback resistor segments). For example, the fixed input resistor RI can be coupled with the virtual ground node 112A via an input switch, the fixed input resistor RIB can be coupled with the virtual ground node 112B via an input switch, the fixed feedback resistor RFB can be coupled with the virtual ground node 112A via a feedback switch, and/or the fixed feedback resistor RFBB can be coupled with the virtual ground node 112B via another feedback switch. In some embodiments, such switches are set to an ON state during operation. In some embodiment, such switches may be set to an OFF state during operation.

Further, the operations and steps described with reference to the preceding FIGURES illustrate only some of the possible scenarios that may be executed by, or within, the various apparatuses, processors, devices, and/or systems, described herein. Some of these operations may be deleted or removed where appropriate, or these steps may be modified or changed considerably without departing from the scope of the discussed concepts. In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

In various implementations, amplifier 100 of the FIGURES can be coupled with a motherboard of an associated electronic device or system. The motherboard can be a general circuit board that can hold various components of an internal electronic system of the electronic device and, further, provide connectors for other peripherals. More specifically, the motherboard can provide the electrical connections by which the other components of the system can communicate. Any suitable processors (inclusive of digital signal processors, microprocessors, supporting chipsets, etc.), memory elements, etc. can be suitably coupled with the motherboard based on a particular configuration needs, processing demands, computer designs, other considerations, or a combination thereof. Other components, such as external storage, controllers for videos display, sound, and peripheral devices may be attached to the motherboard as plug-in cards, via cables, or integrated into the motherboard itself.

In various implementations, amplifier 100 of the FIGURES can be embedded in stand-alone modules (for example, a device with associated components and circuitry configured to perform a specific application or function) or integrated as plug-in modules into application specific hardware of electronic devices. Note that particular embodiments of the present disclosure may be readily included in a system-on-chip (SOC) package. An SOC represents an integrated circuit that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In other embodiments, the amplification functions described herein may be implemented in one or more semiconductor cores (such as silicon cores) in application specific integrated circuits (ASICs), field programmable gate arrays (FPGAs), other semiconductor chips, or combinations thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "steps for" are specifically used in the particular claims; and (b) does not intend, by any statement in the specification, to limit this disclosure in any way that is not otherwise reflected in the appended claims.

What is claimed is:

1. An amplifier comprising:
    a first virtual ground node;
    a second virtual ground node;
    an operational amplifier having a differential input and an output, wherein the differential input includes a first input terminal and a second input terminal;
    a resistive input section coupled with the differential input of the operational amplifier, wherein the resistive input section includes:
        a fixed input resistor coupled with the first virtual ground node, and
        a switchable input resistor segment coupled with the fixed input resistor in parallel, wherein the switchable input resistor segment includes an input resistor, a first input switch, and a second input switch, wherein the input resistor is coupled with the first virtual ground node via the first input switch and the second virtual ground node via the second input switch, and further wherein the first virtual ground node is a virtual ground of the operational amplifier and the second virtual ground node is an input common mode node of the first input terminal and the second input terminal.

2. The amplifier according to claim 1, wherein the first virtual ground node is coupled with one of an inverting input and a non-inverting output of the operational amplifier.

3. The amplifier according to claim 1, further including:
    a resistive feedback section coupled with the output of the operational amplifier, wherein the resistive feedback section includes:
        a fixed feedback resistor coupled with the first virtual ground node, and
        a switchable feedback resistor segment coupled with the fixed feedback resistor in parallel, wherein the switchable feedback resistor segment includes a feedback resistor and a feedback switch, wherein the feedback resistor is coupled with the first virtual ground node via the feedback switch.

4. The amplifier according to claim 1, further including an inverter coupled with the first input switch and the second input switch.

5. The amplifier according to claim 1, further including a voltage supply for setting a voltage drive level for the first input switch and the second input switch, wherein the voltage supply is associated with an input common mode voltage.

6. The amplifier according to claim 5, wherein the voltage supply is further coupled with the second virtual ground node.

7. The amplifier according to claim 1, wherein the second switch is configured to be in a first state when the first switch is in a second state, and the second switch is configured to be in the second state when the first switch is in the first state.

8. The amplifier according to claim 1, further including a first resistor and a second resistor coupled in series and configured to integrate the first input terminal and the second input terminal.

9. The amplifier according to claim 8, further including a buffer coupled with the first resistor, the second resistor, and the second virtual ground node.

10. The amplifier according to claim 8, wherein a joint node between the first resistor and the second resistor is coupled with a ground terminal via a capacitor.

11. A method for setting a gain of an amplifier, the method comprising:
    selectively coupling a switchable input resistor segment of a resistive input switching network to a first virtual ground node of the amplifier via a first switch of the switchable input resistor segment and to a second virtual ground node of the amplifier via a second switch of the switchable input resistor segment; and
    switching the switchable input resistor segment in parallel with a fixed input resistor of the resistive input switching network, wherein the second virtual ground node is an input common mode node of the amplifier and the fixed input resistor is coupled with the first virtual ground node.

12. The method according to claim 11, further comprising setting a state of the second switch based on a state of the first switch.

13. The method according to claim 11, further comprising setting a voltage drive level for the first switch and the second switch based on an input common mode voltage associated with an input of the amplifier.

14. The method according to claim 11, further comprising providing an operational amplifier having a differential input and an output, wherein:
    the differential input include a first input terminal and a second input terminal,
    the resistive input switching network is coupled with the differential input of the operational amplifier,
    the switchable input resistor segment includes an input resistor and is selectively coupled to the first virtual ground node by coupling the input resistor to the first virtual ground node via the first switch and to the second virtual ground node by coupling the input resistor to the second virtual ground node via the second switch, the first virtual ground node is a virtual ground of the operational amplifier, and the second virtual ground node is an input common mode node of the first input terminal and the second input terminal.

15. An amplifier configured to set a gain for a signal, the amplifier comprising:

means for amplifying the signal according to the gain;

means for selectively coupling a switchable input resistor segment of a resistive input switching network to a first virtual ground node of the amplifier via a first switch of the switchable input resistor segment and to a second virtual ground node of the amplifier via a second switch of the switchable input resistor segment; and means for switching the switchable input resistor segment in parallel with a fixed input resistor of the resistive input switching network, wherein the second virtual ground node is an input common mode node of the amplifier.

16. The amplifier according to claim 15, further comprising means for integrating voltage received at a differential input of the amplifier, wherein the second virtual ground node is an integrated voltage of the differential input.

17. The amplifier according to claim 15, further comprising means for providing an operational amplifier having a differential input and an output, wherein:

the differential input include a first input terminal and a second input terminal, the resistive input switching network is coupled with the differential input of the operational amplifier, the switchable input resistor segment includes an input resistor and is selectively coupled to the first virtual ground node by coupling the input resistor to the first virtual ground node via the first switch and to the second virtual ground node by coupling the input resistor to the second virtual ground node via the second switch, the first virtual ground node is a virtual ground of the operational amplifier, and the second virtual ground node is an input common mode node of the first input terminal and the second input terminal.

18. The amplifier according to claim 15, further comprising inversion means coupled with the first switch and the second switch.

19. The amplifier according to claim 15, further comprising a voltage supply for setting a voltage drive level for the first switch and the second switch, wherein the voltage supply is associated with an input common mode voltage.

* * * * *